hydrofluoric acid
sodium borate solution
+ glacial acetic acid

United States Patent Office 2,983,591
Patented May 9, 1961

2,983,591

PROCESS AND COMPOSITION FOR ETCHING SEMICONDUCTOR MATERIALS

Richard R. Stead, Richardson, Tex., assignor to Texas Instruments Incorporated, Dallas, Tex., a corporation of Delaware No Drawing. Filed Nov. 15, 1957, Ser. No. 696,633
7 Claims. (Cl. 41—42)

This invention relates to the etching of surfaces of semiconductor materials, such as germanium and silicon, in the course of preparing them for use in electrical semiconductor devices, such as diodes and transistors, and to an etching solution particularly adapted for this use.

Almost all semiconductor diodes, transistors and other such devices utilize very small blocks or bars of monocrystalline semiconductor material to which are affixed two or more electrical connections. To achieve a workable device, the bars or blocks must be treated in some fashion before the leads are attached to remove any foreign materials or contaminants from their surfaces and also to remove any crystal lattice defects on their surfaces. Such crystal lattice defects are caused by the cutting and sawing operations necessary to cut large single crystals of semiconductor material into bars and blocks of the proper size for use in semiconductor devices. Further, after the leads have been attached to the treated bars such as by alloying or electrical bonding, it is desirable to "clean" the connections by removing material not completely alloyed or bonded from around the connection since this material may bridge the connection and cause shorting.

Both of these cleaning steps are usually accomplished by subjecting the bars or blocks to an acid etching treatment. Probably the most widely used etching solution in the prior art comprises hydrofluoric acid, nitric acid, acetic acid and a small amount of bromine. This etching solution has become generally known and is referred to as CP–4.

In accordance with this invention, it has been discovered that the first cleaning step may be accomplished much more expediently by the use of an improved etching solution of new composition, this solution being composed essentially of nitric acid, hydrofluoric acid and sodium borate. The second cleaning step (i.e. after the leads have been attached) may be accomplished by using an etching solution similar to that employed in the first cleaning step; this second borate etch is composed of the same ingredients as the first except that a portion of the hydrofluoric acid is replaced by an equal volume of acetic acid. In experiments using these improved etching solutions, it has been found that the solutions are far more stable than the standard CP–4 solution, and etching is subject to better control without pitting of the surface of the semiconductor material. Moreover, a faster etching takes place with the resultant surface of the semiconductor element much improved over elements etched in the standard solution. Further, germanium units of various types and silicon n-p-n units etched in the solutions of this invention showed improved $I_{co}$, Z and $\beta$ characteristics over similar units etched in the standard solution. As is well known to those skilled in the art, these symbols designate, in general, the characteristics of reverse polarity current, collector voltage breakdown and small signal current amplification factor, respectively, of a transistor. Additionally, the use of these improved etching solutions provides an improved, chemically polished surface upon which it is much easier for the observer to locate the junction between the materials of two different types of conductivity and thus the point at which a lead or leads must be attached.

Accordingly, an object of this invention is to provide an improved process for the preparation of the surfaces of semiconductor materials used in electrical semiconductor devices by etching the surfaces in a solution comprised of hydrofluoric acid, nitric acid and sodium borate.

A further object of this invention is to provide improved etching solutions which comprise hydrofluoric acid, nitric acid and sodium borate.

An additional object of this invention is to provide improved etching solutions which comprise hydrofluoric acid, nitric acid, acetic acid and sodium borate.

Other and further objects and advatnageous features of this invention will hereinafter more fully appear in connection with the detailed description which follows.

According to this invention, electrical semiconductors, such as silicon and germanium, can be chemically polished under controlled conditions to produce improved characteristics and finish by the use of an etching solution which consists of about 80 parts by volume of nitric acid (CP), about 20 parts by volume of 50% hydrofluoric acid and about 1 part by volume of 3.8% sodium borate solution. The etching solution for the second cleaning step consists of about 80 parts by volume of nitric acid (CP), 10 parts by volume of 50% hydrofluoric acid, 10 parts by volume of glacial acetic acid, and 1 part by volume of 3.8% sodium borate solution.

It is obvious that a lesser amount of more concentrated hydrofluoric acid may replace the amounts of 50% hydrofluoric acid specified without losing the effectiveness of the etching solution. However, in such cases, it will be found desirable to add a sufficient amount of distilled water to bring the total concentration in line with those that will result from the mixing of the reagents specified in the concentrations and proportions as set forth above.

For the first cleaning step of the semiconductor devices, a comparison test was conducted on Ge p-n-p type wafers using a standard CP–5 solution as the control standard; this CP–5 etching solution consists essentially of 50 parts by volume of nitric acid (CP), 30 parts by volume of 50% hydrofluoric acid and 30 parts by volume of glacial acetic acid. The wafers were sorted into three groups according to thickness. About one-half of each group, hereinafter referred to as the test group, was cleaned in the borate etch first recited above; the remaining portion of each group, hereinafter referred to as the control group, was then cleaned in the standard CP–5 etch. It was noted that this borate etch produced a mirror surface on the semiconductors after approximately 45 seconds and the approximate etching rate was about 1.9 mils per minute. On the other hand, the CP–5 etch worked very slowly and the surface of the wafers appeared only slightly etched after 60 seconds; the approximate rate of etching of the CP–5 solution was about 0.2 mil per minute.

After the first cleaning step as indicated above, dots and tabs selected from the same sources were alloyed to the wafers of each of the control groups and each of the test groups under identical baking conditions, i.e., the same furnace was employed using the same temperature. The time element was minimized by baking each test group immediately after its corresponding control group. After alloying, each of the control groups was etched by the same operator using a 3A etch which is standard in the art and which consists of 30 parts by volume of hydrofluoric acid, 30 parts by volume of nitric and 30 parts by volume of water. The corresponding test groups were etched simultaneously by a second operator using the second recited borate etch. At this point, all of the semiconductor units were tested to determine their $\beta$ characteristics and for the purpose of discarding any units which were not acceptable for various reasons. Although substantially equal quantities from the control groups and test groups were considered as acceptable, only 44.5% of the control units tested exhibited high $\beta$ characteristics, whereas in the test units 54.9% showed high $\beta$ characteristics.

Leads were then attached to all of the above units both from the control groups and the test groups and the units were put in headers. All control units were stream etched in a CP–4 solution by one operator, and simultaneously all test units were stream etched by a second operator employing the second borate etching solution. Etching time was the same for all units. All of these units were then further tested to determine their acceptability at this point. Of the total number of units in the control groups, 59.4% were considered acceptable and 35.8% were rejected as having a high $I_{co}$. On the other hand, 74.6% of the test units were considered acceptable and only 16.8% of them rejected as having a high $I_{co}$.

The acceptable units from the last tests were next put through the production temperature and humidity cycles, and the final tests were then made. In this last test, 63.8% of the control units were considered acceptable while 31.0% of them were rejected as having a high $I_{co}$. On the other hand, 76.7% of the test units were considered acceptable and only 19.2% of them were rejected as having a high $I_{co}$.

Although the etching solution containing sodium borate has been described in the proportions that have produced optimum results on the specimens tested, there is a range of proportions that shows improvement over the standard CP–4 etching solution. This range includes 10 to 80 parts by volume for the concentrated nitric acid, 10 to 50 parts by volume of 50% hydrofluoric acid, 0 to 150 parts by volume of glacial acetic acid and 1 part by volume of 3.8% sodium borate solution.

Whereas the instant invention has been described in terms of the specific concentrations set forth above it should be obvious that other modfifications apart from those indicated herein may be made within the spirit of this invention.

What is claimed is:

1. A method of etching a surface of an electrical semiconductor which comprises etching said surface in a solution of nitric acid, hydrofluoric acid, and sodium borate.

2. A method as claimed in claim 1 in which the etching solution has added thereto acetic acid.

3. A method as claimed in claim 1 in which the electrical semiconductor is germanium.

4. A method as claimed in claim 1 in which the electrical semiconductor is silicon.

5. An etching solution for etching the surface of electrical semiconductors which comprises a solution of 80 parts by volume of concentrated nitric acid, 20 parts by volume of 50% hydrofluoric acid, and 1 part by volume of 3.8% sodium borate solution.

6. An etching solution for etching the surface of electrical semiconductors which comprises a solution of 80 parts by volume of concentrated nitric acid, 10 parts by volume of 50% hydrofluoric acid, 10 parts by volume of glacial acetic acid and 1 part by volume of 3.8% sodium borate solution.

7. An etching solution for etching the surface of electrical semiconductors which comprises a solution of 10 to 80 parts by volume of concentrated nitric acid, 10 to 50 parts by volume of 50% hydrofluoric acid, 0 to 150 parts by volume of glacial acetic acid and 1 part by volume of 3.8% sodium borate solution.

References Cited in the file of this patent

UNITED STATES PATENTS

| | | |
|---|---|---|
| 2,794,846 | Fuller | June 4, 1957 |
| 2,805,370 | Wilson | Sept. 3, 1957 |
| 2,827,367 | Cox | Mar. 18, 1958 |
| 2,847,287 | Landgren | Aug. 12, 1958 |
| 2,871,110 | Stead | Jan. 27, 1959 |